(12) United States Patent
Fujisawa et al.

(10) Patent No.: US 6,569,767 B1
(45) Date of Patent: May 27, 2003

(54) SEMICONDUCTOR DEVICE AND ITS PRODUCTION PROCESS

(75) Inventors: Kazunori Fujisawa, Fukuyama (JP); Nobuyoshi Awaya, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 21 days.

(21) Appl. No.: 09/697,161

(22) Filed: Oct. 27, 2000

(30) Foreign Application Priority Data

Jan. 21, 2000 (JP) ........................................ 2000-012979

(51) Int. Cl.[7] .......................... H01L 21/44; H01L 23/52
(52) U.S. Cl. ........................................ 438/687; 257/762
(58) Field of Search ................................ 438/612–617, 438/626–633, 644–658, 664, 687; 257/741, 761–766, 771–784

(56) References Cited

U.S. PATENT DOCUMENTS 6,181,013 B1 * 1/2001 Liu et al. ..................... 257/762
6,251,775 B1 * 6/2001 Armbrust et al. ............ 438/644
6,303,505 B1 * 10/2001 Ngo et al. .................... 438/687

FOREIGN PATENT DOCUMENTS

JP         8-78410        3/1996
JP        11-135506        5/1999

* cited by examiner

*Primary Examiner*—Matthew Smith
*Assistant Examiner*—Calvin Lee
(74) *Attorney, Agent, or Firm*—Nixon & Vanderhye P.C.

(57) ABSTRACT

A process for producing a semiconductor device comprising the steps of: forming a metal wiring layer containing copper as the main component on a semiconductor substrate; forming an insulating film on the entire surface of the resulting semiconductor substrate; removing the insulating film only from a place where a wire of gold or aluminum is to be bonded, in order to expose a part of the metal wiring layer; forming a layer of copper silicide or a layer of a compound of copper and boron in a surface layer of the exposed part of the metal wiring layer; and bonding a wire to a surface of the layer of copper silicide or the layer of the compound of copper and boron.

7 Claims, 4 Drawing Sheets

SEMICONDUCTOR DEVICE AND ITS PRODUCTION PROCESS

CROSS-REFERENCE TO RELATED APPLICATION

This application is related to Japanese Patent Application No. 2000-12979 filed on Jan. 21, 2000, whose priority is claimed under 35 USC §119, the disclosure of which is incorporated by reference in its entirety.

BACKGROUND OF THE INVENTION

1. Field of the Invention

The present invention relates to a semiconductor device and a process for producing the same. More particularly, it relates to a semiconductor device and its production process which allows direct bonding of a wire on a metal wiring layer containing copper as a main component without need to form an aluminum pad for bonding.

2. Description of Related Art

A metal wiring layer containing copper is of low electric resistance and exhibit good resistance to migration. For this reason, it can reduce signal delay owing to the metal wiring layer in a integrated circuit of a semiconductor device. Especially when the semiconductor device is operated at high-density current, the metal wiring layer containing copper can ensure high reliability. From this viewpoint, copper has begun to be used as a material for the metal wiring layer in place of aluminum.

At present, the metal wiring layer containing copper is used mainly in the semiconductor device having a high-speed logic circuit such as a microprocessor. For packaging the semiconductor device, utilized is a flip-chip technique in which a bump is formed on the semiconductor device (semiconductor chip). In the semiconductor device for general use, bonding is performed using a wire of gold or aluminum. This bonding involves heating at about 200° C. at the lowest. Since copper is easily oxidized to its inside at this temperature, it is difficult to perform the bonding without affecting the quality of the devices.

To cope with this inconvenience, proposed are methods of providing an aluminum pad on the metal wiring layer of copper with or without intervention of a diffusion-barrier layer of metal (see Japanese Unexamined Patent Publications Nos. HEI 8(1996)-78410 and HEI 11(1999)-135506).

One example of the above-mentioned methods is now explained with reference to FIGS. 3(a) to 3(e).

A diffusion layer 10 is formed on a silicon substrate 1, and thereafter, an insulating film is formed of $SiO_2$, SiN or the like as an interlayer dielectric film 2. Subsequently, a contact hole is opened in the interlayer dielectric film 2. An adhesion promoting layer 4 is formed of TiN by CVD for enhancing the adhesion of the interlayer dielectric film 2 to a copper wiring layer 5 formed later. This adhesion promoting layer 4 also functions as a diffusion-barrier film for preventing diffusion of copper from the copper wiring layer 5 to the interlayer dielectric film 2. By forming a copper film on the adhesion promoting layer 4 by DC sputtering, the contact hole is filled with a copper film 5' (see FIG. 3(a)).

Subsequently, an anti-reflection film 11 is formed on the copper film 5' (see FIG. 3(b)).

Next, the copper film 5' is formed into the copper wiring layer 5 having a desired pattern by photolithography step and etching step. Subsequently, a surface protection film 12 is formed of an insulating film such as of $SiO_2$, SiN or the like on the surface of the copper wiring layer 5. Further, the surface protection film 12 and the anti-reflection film 11 are selectively removed to expose a part of the copper wiring layer 5. Thus a pad region 7a is opened (see FIG. 3(c)).

After the pad region 7a is opened, a diffusion-barrier layer 3 such as of TiN and an oxidation-resistant metal film 13 such as of AlSiCu are formed in thicknesses of about 20 to 100 nm and about 2 μm, respectively, in the opening of the pad region 7a. Subsequently, the diffusion-barrier layer 3 and the oxidation-resistant metal film 13 are left existing only in the vicinity of the pad region 7a (FIG. 3(d)).

By adopting this construction in which the copper wiring layer 5 in the pad region 7a is covered with the oxidation-resistant metal film 13, it is possible to prevent the oxidation of the copper wiring layer 5 during bonding not only by ultrasonic wire bonding, according to which a bonding face is heated to 200° C. or higher, but also by thermocompression wire bonding, according to which the bonding face is heated to 400° C. or higher. FIG. 3(e) illustrates a state in which a wire 8 is bonded in the pad region 7a.

FIG. 4 is a schematic sectional view of an example of semiconductor device having two copper-containing wiring layers to which a wire is bonded as disclosed by Japanese Unexamined Patent Publication No. HEI 11(1999)-135506. This semiconductor device is produced as follows; first, a copper wiring layer 5b formed by a damascene method is covered with an insulating film 6, and a bonding pad portion is opened. Thereafter, the insulating film 6 is covered with an aluminum-containing film 9, and the aluminum-containing film 9 is partially removed by photolithography step and etching step so as to remain in the bonding pad portion; next, a wire 8 of gold, aluminum or the like is bonded to the bonding pad portion. In the figure, 2a to 2d denote interlayer dielectric films, 3a to 3c diffusion-barrier films, 4a and 4b copper-diffusion-barrier films and 5a a copper wiring layer.

In the method shown in FIGS. 3(a) to 3(e), the diffusion-barrier layer and the oxidation-resistant layer are formed on the entire surface, and then selectively removed by photolithography step and etching step in such a manner that they remain in the bonding pad portion. Accordingly, this method requires a large number of production steps, and involves an increase in production costs.

The method shown in FIG. 4, in which a pad of the aluminum-containing film is formed as a bonding pad on the copper wiring layer, requires the addition of the step of depositing either aluminum or aluminum and a diffusion-barrier metal, and a photolithography step and etching step or a chemical mechanical polishing step. For this reason, this method requires more production steps than aluminum interconnecting, and involves an increase in the production costs.

SUMMARY OF THE INVENTION

Accordingly, the present invention provides a process for producing a semiconductor device comprising the steps of: forming a metal wiring layer containing copper as the main component on a semiconductor substrate; forming an insulating film on the entire surface of the resulting semiconductor substrate; removing the insulating film only from a place where a wire of gold or aluminum is to be bonded, in order to expose a part of the metal wiring layer; forming a layer of copper silicide or a layer of a compound of copper and boron in a surface layer of the exposed part of the metal wiring layer; and bonding a wire to a surface of the layer of copper silicide or the layer of the compound of copper and boron.

Further, the present invention provides a semiconductor device comprising a metal wiring layer containing copper as a main component on a semiconductor substrate; and a layer of copper silicide or a layer of a compound of copper and boron for bonding a wire, the layer being formed in a surface layer of a part of the metal wiring layer.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1D:
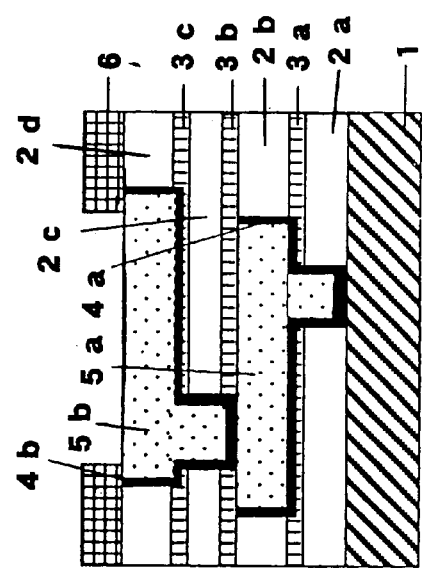
FIGS. 1(a) to 1(e) are schematic sectional views illustrating a process of producing a semiconductor device in accordance with the present invention.
Figure 1E:
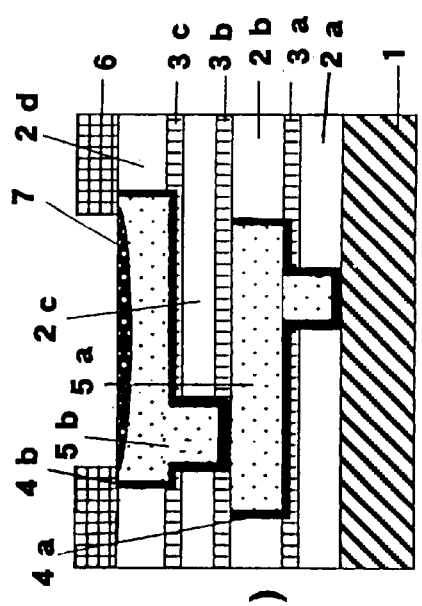
Figure 1A:
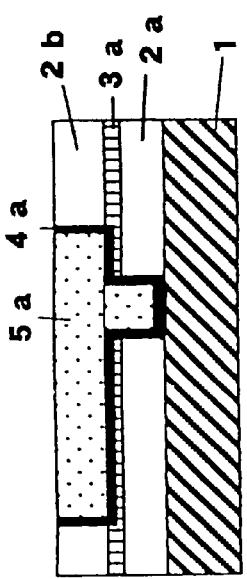

The present invention is now described in detail with reference to FIGS. 1(a) to 1(e) and FIG. 2. It is noted that these figures merely present an example and should not be construed to limit the present invention.

FIGS. 1(a) to 1(e) are schematic sectional views illustrating an example of process of producing a semiconductor device according to the present invention in order. Here, the example illustrates the process applied to a device having two wiring layers, but the process of the present invention is applicable to a single-layer wiring structure or a multi-layer wiring structure having three or more wiring layers.

First, an interlayer dielectric layer 2a and a diffusion-barrier layer 3a are formed on a substrate 1, for example, by CVD or by spin coating. Here, the substrate may be any known substrate without particular limitation. For example, the substrate may an elementary substrate such as a silicon substrate and a germanium substrate, or a compound substrate such as a GaAs substrate. Further, elements such as transistors, loads and the like may be formed on the substrate beforehand. In FIGS. 1(a) to 1(e), elements potentially existing on the substrate are omitted.

As the interlayer dielectric film, usable are a $SiO_2$ film, SiN film, SiON film, PSG film, BPSG film, F-containing $SiO_2$ film and besides these, various types of films with low dielectric constants. As the diffusion-barrier layer, usable is an insulating film which provides an etching selective ratio with respect to the interlayer dielectric film and is capable of preventing diffusion of copper. Examples of such insulating films include SiNx, SiC and the like.

Next, a contact hole and a trench for a first wiring layer are formed by photolithography step and etching step. After the trench for interconnection is formed, a copper-diffusion-barrier film and a copper film for forming the copper wiring layer are formed in this order. Subsequently, unnecessary parts of the copper-diffusion-barrier film and copper film are removed by CMP method. Thus the first wiring layer can be formed of the copper-diffusion-barrier film 4a and the copper wiring layer 5a (see FIG. 1(a)).

The copper-diffusion-barrier layer may be formed of a Ta film, W film, Cr film, TaN film, TiN film, TiW film, TiWN film, WN film, NbN film or the like by sputtering, CVD or the like. The copper film may be formed by sputtering method, CVD method, electrolytic plating method or the like. In addition, a film containing copper as a main component such as a film of a copper silver alloy, copper zirconium alloy or the like may be used as the copper film.

Figure 1B:
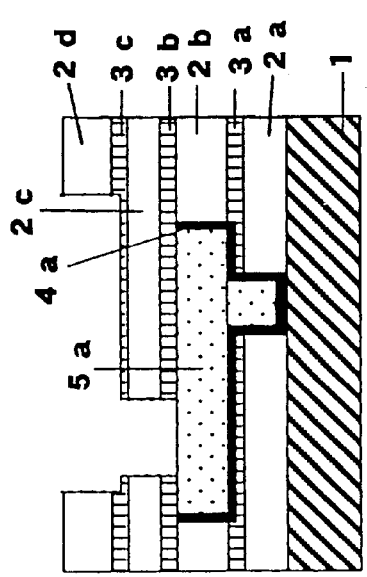
Figure 1C:
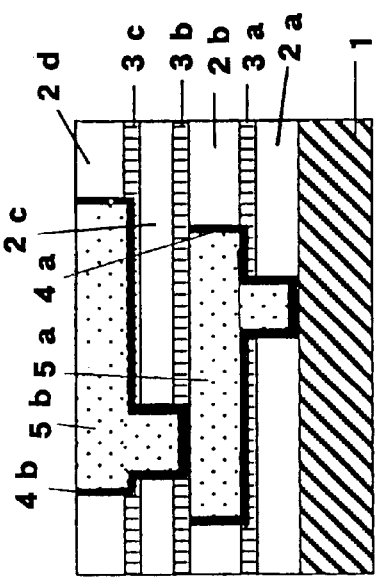

Further, a second copper wiring layer is formed in the same manner as the first copper wiring layer is formed (see FIGS. 1(b) and 1(c)). In the figures, 2b to 2d denote interlayer dielectric films, 3b and 3c diffusion-barrier films, 4b a copper-diffusion-barrier film, and 5b the second copper wiring layer. The thickness of the copper wiring layer in the bonding pad portion to be exposed in the following step may preferably be 0.5 to 2 μm in consideration of the silicidation and boronation of its surface.

Next, an insulating protective film 6 such as of SiNx is formed on the entire surface, for example, by CVD method, and then the surface of the copper wiring layer in the bonding pad portion is exposed by photolithography step and etching step (see FIG. 1(d)).

Thereafter, the surface of copper in the bonding pad portion is heated in a reaction chamber separated from the air and maintained in nitrogen atmosphere or in vacuum. The reason for maintaining the nitrogen atmosphere or vacuum is that, if a wafer with copper exposed were heated in air, copper would be oxidized. For this reason, an apparatus having a load-lock chamber may be preferably used for executing the present invention.

Subsequently, a monosilane ($SiH_4$) gas or diborane ($B_2H_6$) gas is introduced into the reaction chamber. The surface of copper is exposed to the gas to form a layer 7 of copper silicide or a copper-boron compound on the exposed surface of copper (FIG. 1(e)). As gases for silicidation, a disilane ($Si_2H_6$) gas, difluorosilane ($SiH_2F_2$) gas, trisilane ($Si_3H_8$) gas and the like may be mentioned in addition to the monosilane gas.

Here, before the substrate is put in the reaction chamber, an oxide film possibly formed on the surface of copper may preferably be removed so that a fresh face of metallic copper is selectively exposed. The oxide film may be removed using an etching liquid capable of removing copper oxide selectively with respect to copper such as hydrofluoric acid, citric acid or the like.

According to the above-described process of the present invention, the resistance of the copper wiring layer is hardly affected because only the surface of copper in the bonding pad portion is silicidated or boronated. Rather, the surface of copper is preferably silicidated or boronated 10 nm to 100 nm for positively preventing oxidation at bonding.

In contrast, according to the prior-art technique of silicidating the surface of a copper wiring layer, for example, as disclosed in Japanese Unexamined Patent Publication No. HEI 9(1997)-321045, the sidewalls or the entire top surface of the copper wiring layer are required to be silicidated. Accordingly, if silicidation is done sufficiently, then the resistance rises and as a result, the advantage of using the copper wiring layer is lost. Alternatively, if silicidation is done to such a degree that the electric resistance is acceptable, the copper wiring layer may withstand enough within several seconds when a film of $SiO_2$ is made by CVD method under reduced pressure, but the copper wiring layer cannot resist oxidation in a heating or humid atmosphere when a wire is bonded to the bonding pad portion where copper is exposed finally.

The temperature of the substrate, gas flow rate and exposure time may be adjusted to optimal conditions depending on the size of the apparatus, the size of the wafer and the total pressure in the reaction chamber. For example, if a 6-inch wafer is heated on a disk-form heater of 20 cm diameter in a cylindrical reaction chamber of 30 cm diameter and 30 cm depth, the substrate temperature, gas flow rate and exposure time may be 300 to 400° C., 10 to 100 cc/min and 30 seconds to 2 minutes. The pressure in the reaction chamber may be atmospheric pressure or a reduced pressure of 0.1 to 10 Torr. If the silicidation or boronation is carried out under atmospheric pressure, the partial pressure of silane or diborane may preferably be controlled by introducing an inert gas such as nitrogen at a flow rate of 1 L/min or more together with silane or borane.

Various conditions may preferably be adjusted so that the apparent resistivity of copper is within the range of 2.5 to 5 $\mu\Omega$cm in the portion where the copper silicide layer or the layer of the copper-boron compound is formed. Further, according to the present invention, the silicidation or boronation takes place only in the opening of the bonding pad portion, and the rest of the wiring layer is fully protected by the insulating film 6. For this reason, in the present invention, the resistivity only of the exposed part of copper rises. The silicidation or boronation of the surface of copper can be developed until sufficient oxidation-resistant property is obtained, without adverse influences to the performance of circuits.

Figure 2:
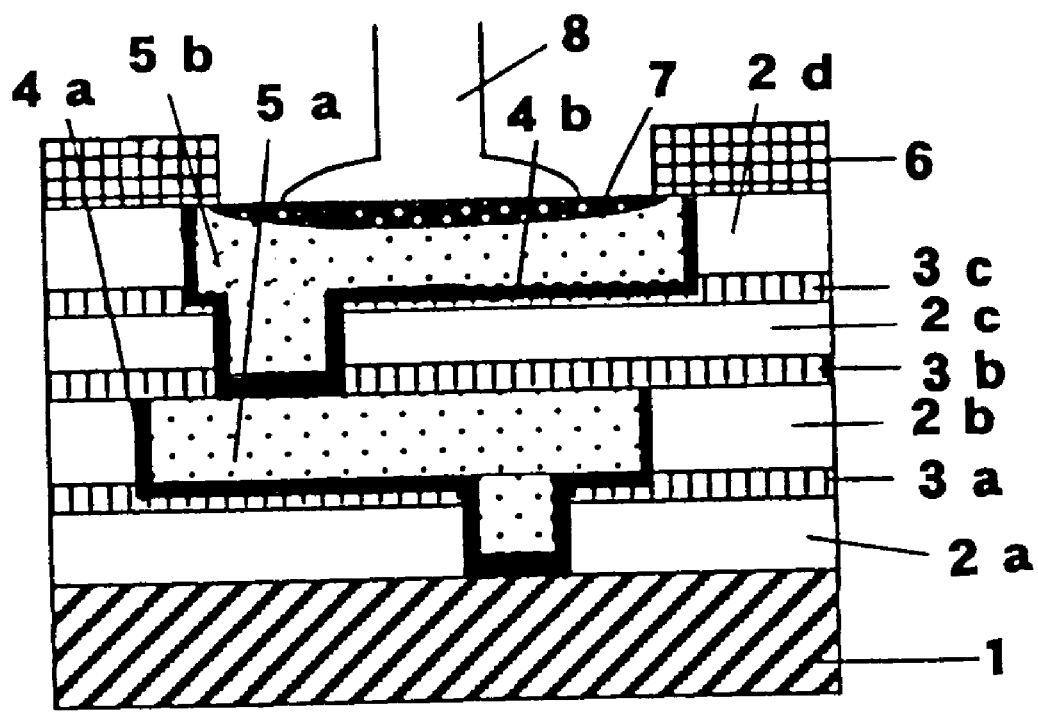
FIG. 2 is a schematic sectional view of a semiconductor device in accordance with the present invention.
Figure 3D:
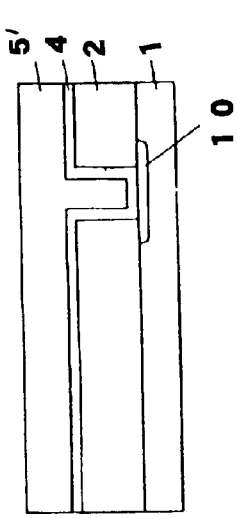
FIGS. 3(a) to 3(e) are schematic sectional views illustrating a prior art process of producing a semiconductor device.
Figure 3E:
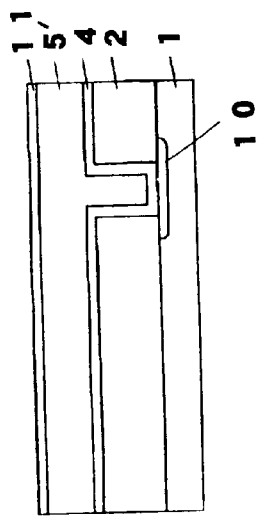
Figure 3A:
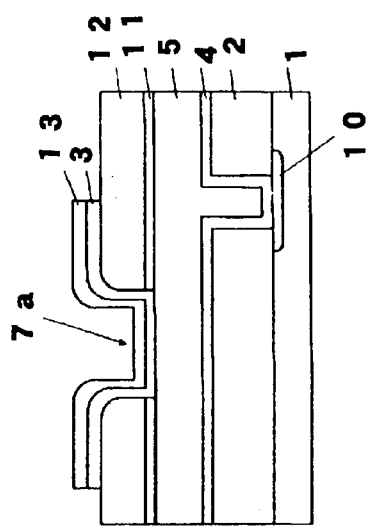
Figure 3B:
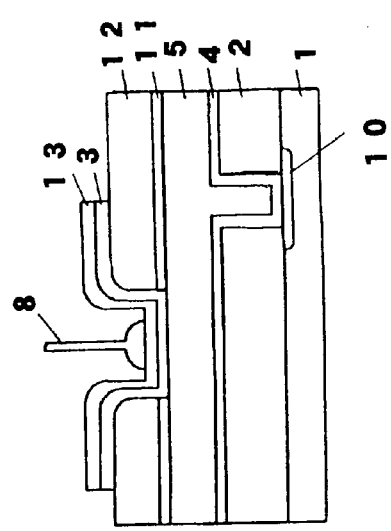
Figure 3C:
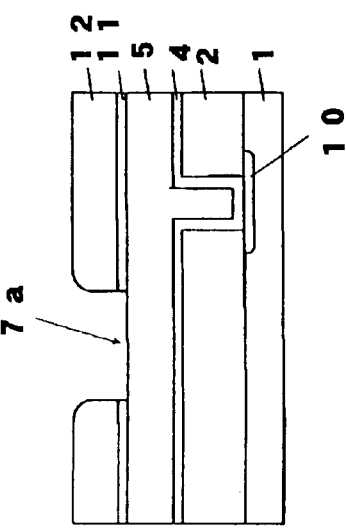
Figure 4:
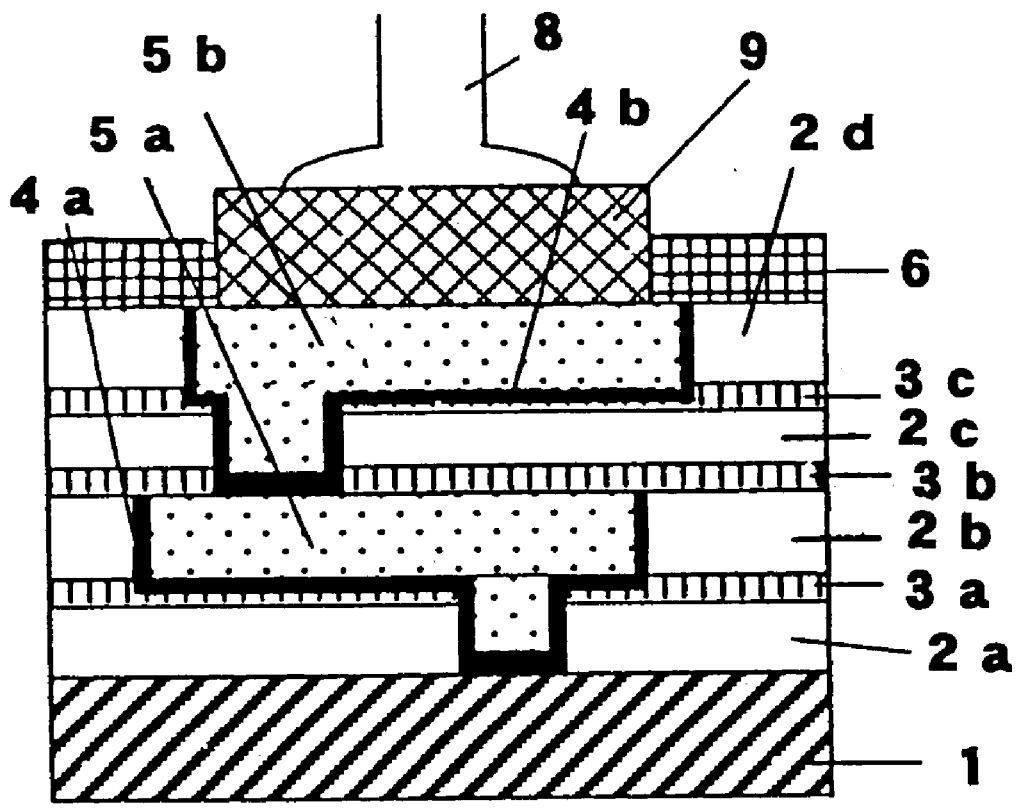
FIG. 4 is a schematic sectional view of a prior art semiconductor device.

Subsequently, the resulting semiconductor device is cut out and fixed to a package, and a wire 8, for example, of gold can be bonded to the copper wiring layer by a known bonding technique (see FIG. 2).

According to-the present invention, (1) it is possible to bond a wire directly to the pad portion of the copper wiring layer without forming an aluminum pad in the pad portion, and (2) it is possible to improve the oxidization-resistant property of the bonding pad portion without causing a rise in the resistance of parts of the wiring layer contributing to circuit performance of the semiconductor device since the oxidization-resistant property of copper is improved only in the bonding pad portion.

Further, according to the present invention, it is possible to provide a semiconductor device ensuring a stable bonding of the wire to the copper wiring layer.

What is claimed is:

1. A process for producing a semiconductor device comprising:
    forming a metal wiring layer containing copper as the main component on a semiconductor substrate;
    forming an insulating film on the entire surface of the resulting semiconductor substrate;
    removing the insulating film only from a place where a wire of gold or aluminum is to be bonded, in order to expose a part of the metal wiring layer;
    forming a layer of copper silicide or a layer of a compound of copper and boron in a surface layer of the exposed part of the metal wiring layer; and
    bonding the wire of gold or aluminum directly to a surface of the layer of copper silicide or the layer of the compound of copper and boron, wherein said bonding is carried out without depositing any conductive layer between gold or aluminum of the wire and the surface of the layer of copper silicide or compound of copper and boron.

2. A process according,to claim 1, wherein the layer of copper silicide or the layer of the compound of copper and boron formed on the surface of the metal wiring layer containing copper as the main component has a thickness of 10 to 100 nm.

3. A process according to claim 1, wherein the layer of copper silicide or the layer of the compound of copper and boron has a resistivity of 2.5 to 5 $\mu\Omega$cm.

4. A process of producing a semiconductor device according to claim 1, wherein the metal wiring layer is selected from layers of copper, a copper-silver alloy and a copper-zirconium alloy.

5. A process for producing a semiconductor device comprising:
    forming a metal wiring layer containing copper as the main component on a semiconductor substrate;
    forming an insulating film on the entire surface of the resulting semiconductor substrate;
    removing the insulating film only from a place where a wire of gold or aluminum is to be bonded, in order to expose a part of the metal wiring layer;
    forming a layer of copper silicide or a layer of a compound of copper and boron in a surface layer of the exposed part of the metal wiring layer;
    bonding a wire directly to a surface of the layer of copper silicide or the layer of the compound of copper and boron; and
    wherein the layer of the compound of copper and boron is formed by reacting diborane with the copper contained in the metal wiring layer.

6. A process for producing a semiconductor device, the process comprising:
    forming a conductive layer comprising copper on a semiconductor substrate;
    forming an insulating film on the semiconductor substrate over the conductive layer comprising copper;
    removing the insulating film from a place where a wire comprising gold or aluminum is to be bonded, in order to expose a part of the conductive layer comprising copper;
    forming a layer comprising a compound of copper and boron in a surface of the exposed part of the conductive layer comprising copper; and
    bonding a wire to a surface of the layer comprising the compound of copper and boron.

7. A process for producing a semiconductor device, the process comprising:
    forming a conductive layer comprising copper on a semiconductor substrate;
    forming an insulating film on the semiconductor substrate over the conductive layer comprising copper;
    removing the insulating film from a place where a wire is to be bonded, in order to expose a part of the conductive layer comprising copper;
    forming a layer comprising copper silicide or a compound of copper and boron in a surface of the exposed part of the conductive layer comprising copper; and
    bonding a wire directly to a surface of the layer comprising the copper silicide or the compound of copper and boron in a manner such that the wire is not bonded directly to any insulating film provided on the substrate.

* * * * *